United States Patent [19]

Matsushima

[11] Patent Number: 4,857,854

[45] Date of Patent: Aug. 15, 1989

[54] DIGITAL FAULT LOCATOR

[75] Inventor: Tetsuo Matsushima, Fuchu, Japan

[73] Assignee: Kabushiki Kaisha Toshiba, Kawasaki, Japan

[21] Appl. No.: 927,190

[22] Filed: Nov. 5, 1986

[30] Foreign Application Priority Data

Nov. 8, 1985 [JP] Japan .................. 60-250238

[51] Int. Cl.$^4$ .......................................... G10R 31/08
[52] U.S. Cl. ..................................... 324/512; 361/65;
361/80; 364/492
[58] Field of Search ............ 324/512, 522, 535;
364/492, 572, 483; 361/80, 65, 79, 86, 87

[56] References Cited

FOREIGN PATENT DOCUMENTS 60-204219 10/1985 Japan .

OTHER PUBLICATIONS

1982 IEEE, PAS-101, No. 8, 82 WM 088—3; T. Takagi et al.
M. Muraoka et al., "Microprocessor-Based Fault Locator", Toshiba Review, No. 148, pp. 11-14, Tokyo, Japan 1984.
L. Eriksson et al., "An Accurate Fault ... Remote-end Infeed", IEEE Transactions On Power Apparatus and Systems, vol. PAS-104, No. 2, Feb. 1985.
B. Jeyasurya et al., "Design and Testing of a Microprocessor-Based Distance Relay", IEEE Transactions On Power Apparatus and Systems, vol. PAS-103, No. 5, May 1984.

Primary Examiner—A. D. Pellinen
Assistant Examiner—Morris Ginsburg
Attorney, Agent, or Firm—Folley & Lardner, Schwartz, Jeffery, Schwaab, Mack, Blumenthal & Evans

[57] ABSTRACT

A digital fault locator of this invention comprises a memory for storing input electric amount from a system and a plurality of digital filters having different filter functions to which electric amounts are supplied from the memory. A fault location is determined by selectively providing a specific one of outputs from the digital filters according to a fault time.

7 Claims, 4 Drawing Sheets

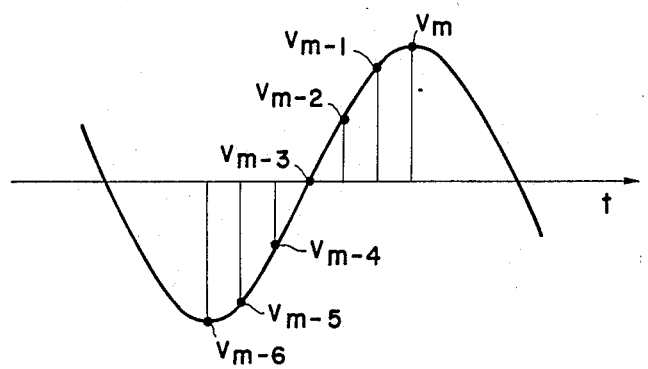
F I G. 3 (a)
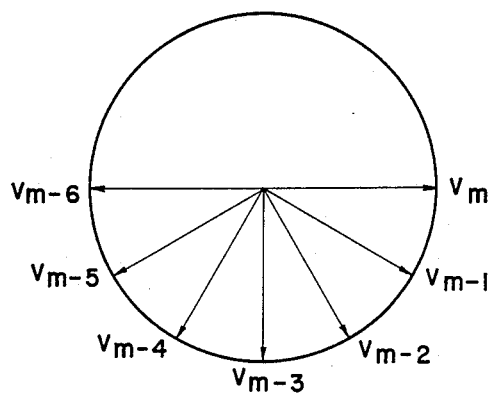
F I G. 3 (b)
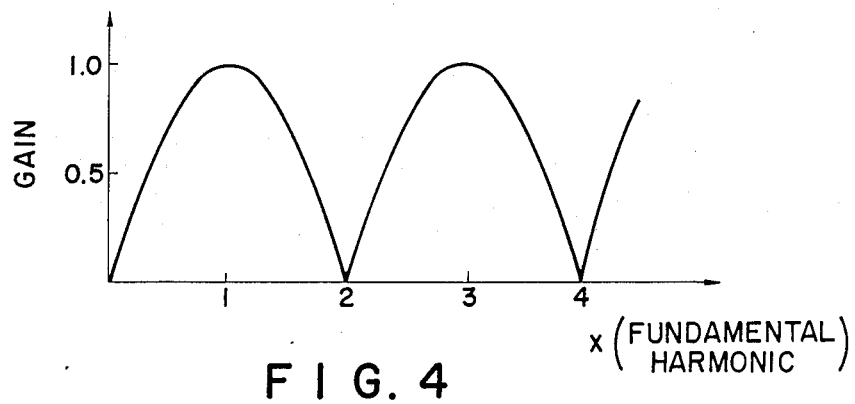
F I G. 4

DIGITAL FAULT LOCATOR

BACKGROUND OF THE INVENTION

1. Field of the Invention

The present invention relates to a digital fault locator for determining a distance from the locator to a point at which a fault of a power transmission line occurs.

2. Description of Prior Art

As a fault locator for a power transmission system, a surge receiving system in which a surge produced at a fault point is received at both terminals of the transmission line and the fault point is located by a difference in receiving time between the terminals and a pulse radar system in which a pulse is transmitted through a power transmission line in which a fault occurs after the fault is detected and a reflection is measured have been used practically. In these systems, however, a signal transmission device is required in parallel to the power transmission line and a blocking coil for blocking a pulse leakage is required, respectively, resulting in an increased cost therefor.

On the other hand, due to the recent development of microcomputers, various fault locating systems have been proposed in which a distance to a fault point is calculated by using voltage and current data of the transmission system to thereby locate the fault point economically.

In a usual digital fault locator using a microcomputer, voltage/current digital data obtained in the transmission line having the fault are stored in a memory circuit and a fault location is performed by a calculation using these data according to known equations.

There are many equations for use in locating the fault point, and, for example, the following equation has been proposed (IEEE, PAS-101, No. 8, 1982, 82WM 088-3).

$$X = \frac{I_m(V_s \cdot I_s''^*)}{I_m(ZI_s \cdot I_s'')} \tag{1}$$

where X is a distance to a fault point, $V_s$ is a voltage at a point at which a locator is provided, $I_s$ is a current measured at the point of the locator, $I_s''$ is a difference between currents measured at the points before and after the fault occurs, Z is an impedance of a unit length of the power transmission line, $I_m$ is an imaginary part and * represents a conjugate complex number.

It is usual that voltage and current of the transmission line in which the fault occurs may contain high harmonics. Particularly, this tendency is increased by recent increased use of facilities such as phase regulation equipments and underground cables. Therefore, in calculating the fault point by using the equation (1), such high harmonics contained in the voltage/current detected in the transmission line are removed by passing them through a low pass filter to obtain the fundamental component.

An analog filter is disposed in a preceding stage to an A/D conversion of an a.c. electric input amount in a usual digital device to remove higher harmonic components. Therefore, the filtering should be performed, after the A/D conversion, in a digital manner by using a microcomputer.

The fault locator is adapted to measure the distance to the fault point accurately and, therefore, an attenuation effect of such digital filter should be as high as possible.

On the other hand, a response of such filter having high attenuation effect is usually slow and thus it is necessary to have a longer time in obtaining a correct calculation.

It is usual that, so long as a protection device operates normally, the fault phenomenon of a power transmission system disappears within a time range from 50 ms to 80 ms. In view of this, the use of a filter whose response is too low is not practical. The time for which the fault of the system persists depends upon the phase of system voltage when the fault occurs and a response time of a circuit breaker provided in the system, etc. Therefore, the filter function should be determined by taking these matters into consideration.

In order to overcome these problems, a digital fault locator has been proposed in Japanese Patent Application Laid-Open No. 204219/1985, which comprises a memory for storing digital data of voltage and current of a power transmission system and a plurality of digital filters having different filter functions, to which the digital data stored in the memory are supplied. Outputs of these digital filters are selectively used according to the time from a detection of the fault to measure the distance to the fault point in real time.

In the fault locator of this type in which the filter outputs are selectively used in real time and a locating operation is performed for each filter output, the time given to the operation is usually too short and, thus, it is sometimes difficult to obtain a desired result of operation. Therefore, the proposed locator is not so practical.

SUMMARY OF THE INVENTION

The present invention was made in view of resolution of the problems mentioned above and an object of the present invention is to provide a digital fault locator capable of measuring a distance to a fault point as accurate as possible according to a persisted time of the fault.

The above object is achieved, according to the present invention, by a locator which comprises a memory for storing electric amounts of an input from a power transmission system and a plurality of digital filters having different filter functions to receive the electric amounts from the memory and in which specific ones of outputs of the digital filters are selectively used according to a persisted time of a fault to measure a distance to the fault point in with an accuracy depending upon the persisting time.

BRIEF DESCRIPTION OF THE DRAWINGS

In the accompanying drawings:

FIGS. 3(a) and 3(b) show a mutual relation of voltage sampled at every electric angle of 30°, respectively;

FIG. 4 shows waveforms for explaining the effect of filter which removes a d.c. component and even numbered harmonics and passes odd numbered harmonics;

DETAILED DESCRIPTION OF THE PREFERRED EMBODIMENTS

Figure 1:
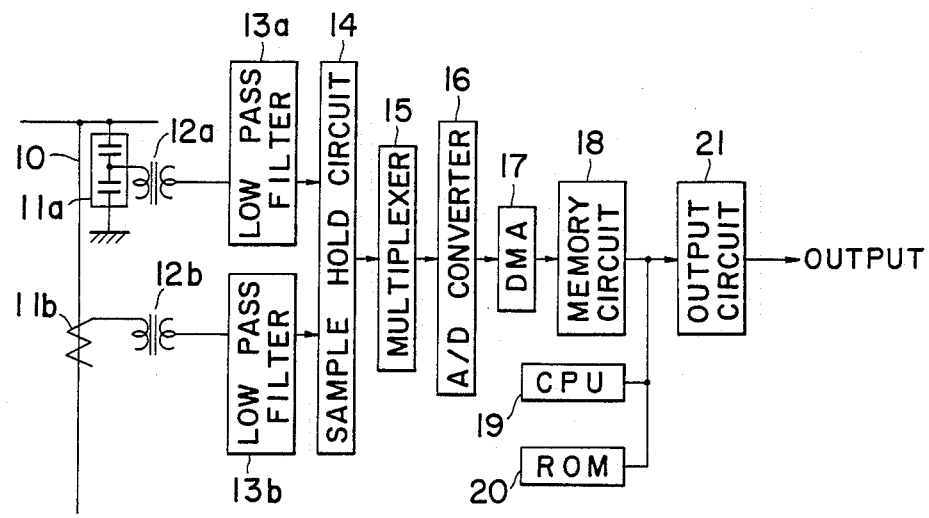
FIG. 1 shows a system construction of a digital fault locator according to the present invention.

FIG. 1 shows a system construction of a digital fault locator according to the present invention. Respective phase voltages of a power transmission system 10 are detected by a voltage detector 11a and converted by a signal converter 12a into voltage signals of suitable magnitude. Respective phase currents are detected by a current detector 11b and converted by a signal converter 12b into voltage signals of suitable magnitude. Outputs of the signal converters 12a and 12b are fed through low-pass filters 13a and 13b to a sample hold circuit 14, sampled therein at predetermined time intervals and held therein, respectively. The analog signals held in the sample hold circuit 14 are fed through a multiplexer 15 to an A/D converter 16 and converted therein into digital signals. Output signals of the A/D converter 16, i.e., digital data are passed through a direct memory access (DMA) circuit 17 and stored in predetermined addresses of a memory circuit 18. The system shown in FIG. 1 includes a central processing unit (CPU) 19 and a read-only memory (ROM) 20 storing a program. The CPU 19 reads out the voltage-current data of the power line stored in the memory 18 according to the program in the ROM 20 and execute an operation of the readout voltage-current data for locating a fault point according to the aforementioned equation (1). A locating result obtained by the CPU 19 is supplied through an output circuit 21 to a printer, a pilot lamp or a display, etc., which is not shown.

Figure 2:
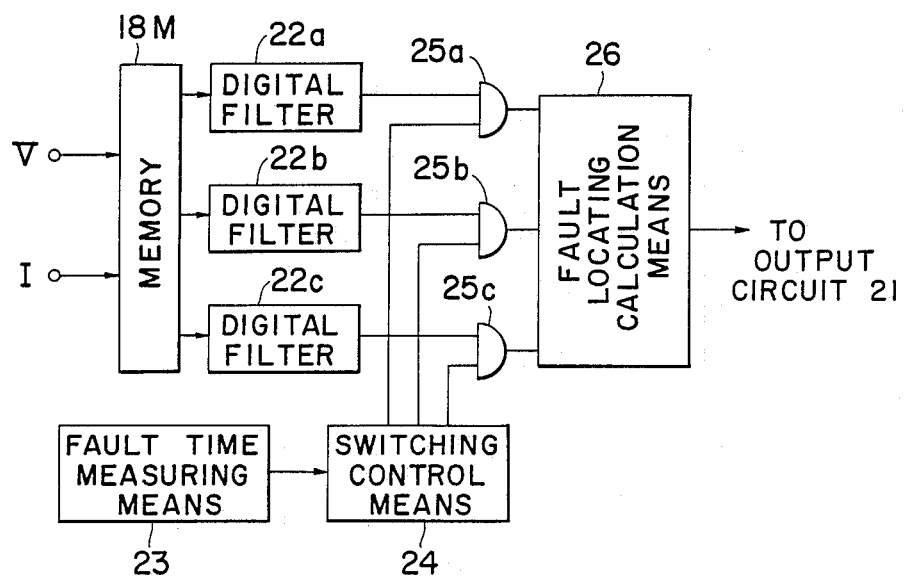
FIG. 2 is a functional block diagram of a portion of the locator for switching input data to be supplied from a memory to a fault locating calculation means.

FIG. 2 shows a function of the CPU 19 in the present digital fault locator. Output data of a memory 18M of the memory circuit 18 (FIG. 1) which stores all of the system voltage and current data V, I are fed through digital filters 22a, 22b and 22c having different response times to first inputs of AND gates 25a, 25b and 25c, respectively. The digital filters 22a, 22b and 22c have filter function characteristics based on equations (3), (5) and (6), respectively. Thus, the response times of the filters 22a, 22b and 22c are different from each other, with that of the filter 22a being fastest and that of the filter 22c being latest, and the filter effects of them increase in the reverse order. When a fault occurs, a persisting time thereof is measured by a fault time measuring device 23 and an output enable signal is fed to a second input terminal of selected one of the AND gates 25a, 25b and 25c through a switching control device 24, the selection being performed according to a measuring result, i.e., the persisting time of the fault. Therefore, any of the AND gates 25a, 25b and 25c to which the output enable signal is supplied from the switching control device 24 passes the output signals from the digital filters 22a, 22b and 22c, selectively, to a fault locating calculation device 26. The device 26 calculates the distance to the fault point, on the basis of the voltage and current data stored in the memory circuit 18 and inputted through the selected one of the digital filters, after the fault is removed by a system protection device, not shown, and sends a result to the output circuit 21. The functions of elements 22a, 22b, 22c, 23, 24, 25a, 25b, 25c, and 26 are performed by software of the CPU 19 (FIG. 1).

Now, the digital filter will be described. It is assumed that voltages of the fundamental frequency sampled at every electric angle of 30° are represented by $V_m$, $V_{m-1}$, $V_{m-2}$, ... FIG. 3a shows $V_m$, $V_{m-1}$, ... in instantaneous value and FIG. 3b shows them in vector plane.

Further, a filter having characteristics represented by $$V_{Fm} = (V_m - V_{m-6})/2 \tag{2}$$

is assumed.

It is clear from the equation (2) that when the input current is a d.c., $V_m = V_{m-6}$ and thus $V_{Fm} = 0$. On the other hand, when the input current has the fundamental frequency, $V_m$ is different in phase from $V_{m-6}$ by 180° and the magnitudes are common. Therefore, $V_{Fm} = V_m$ as is clear from FIG. 3a. Further, when the input current is a harmonic having doubled fundamental frequency, the phases of $V_m$ and $V_{m-6}$ are 360°, respectively, resulting in $V_{Fm} = 0$.

Thus, the filter effect of the filter represented by the equation (2) is to remove the d.c. component and even numbered harmonic components and to pass only odd numbered harmonics as shown in FIG. 4. The equation (2) can be represented as follows:

$$F = (1 - Z^{-N})/2 \tag{3}$$

wherein $Z^{-N}$ represents a harmonic component sampled at a preceding N-th sampling time.

It is generally possible to select the attenuation pole, in which frequency input signal is completely eliminated, arbitrarily by selecting the value of N in the equation (3) suitably. As another example of the digital filter, one which can be represented by an equation (4) can be considered, which is as follows:

$$F = (1 + Z^{-N'})/2 \tag{4}$$

According to the equation (4), the d.c. component is passed through and it is possible to select any attenuation pole by selecting the value of N' suitably.

In order to further improve the filter effect by increasing the attenuation pole, it may be possible to use the filters of the equation (3) or (4) in series.

One example of such may have the following digital function:

$$F = (1 - Z^{-N1}) \cdot (1 - Z^{-N2})/2 \tag{5}$$

and another example may have the following function:

$$F = (1 - Z^{-N1}) \cdot (1 - Z^{-N2}) \cdot (1 - Z^{-N3})/8 \tag{6}$$

Figure 5:
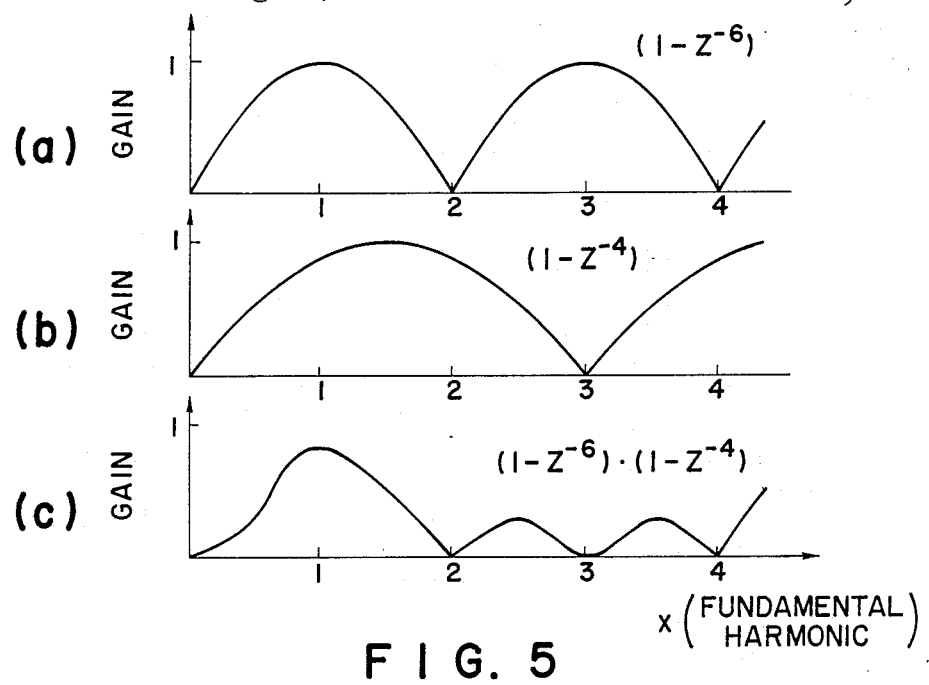
FIG. 5 shows waveforms for clarifying what filter effect is obtained depending upon filter functions.

FIG. 5 shows a filter according to the equation (5) with N1=6 and N2=4.

As to the response time of the filter of the equation (3), (5) or (6), the equation (3) uses a new data and a data sampled at a preceding Nth sampling time, the equation (5) uses a data sampled at a preceding (N1+N2)th sampling time and the equation (6) uses a data sampled at a preceding (N1+N2+N3)th sampling time. Therefore, it can be said, generally, that the response time of the filter reduces with increase of attenuation characteristics thereof.

The digital filters 22a, 22b and 22c in FIG. 2 are constituted so as to have the filter function characteristics of the equations (3), (5) and (6), respectively.

Figure 6:
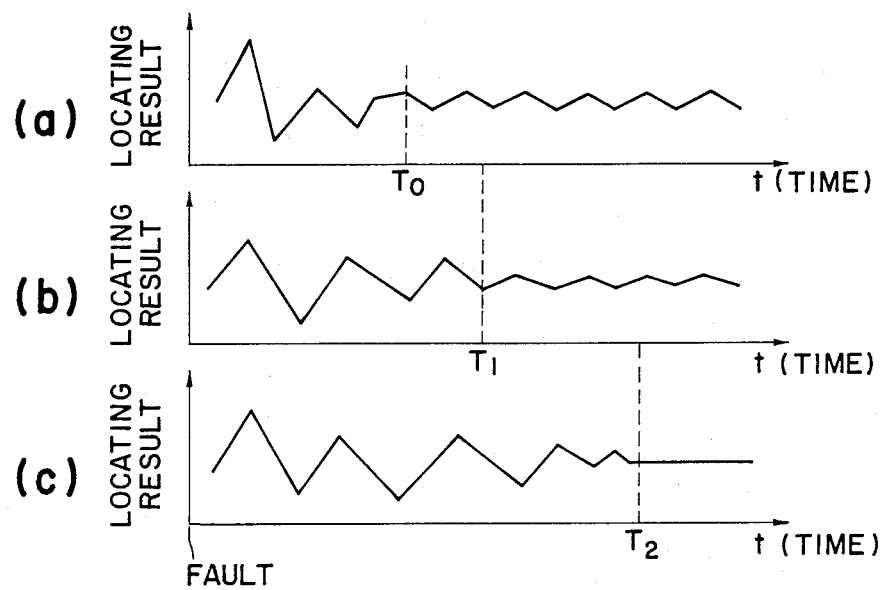
FIG. 6 shows a locating result obtained by the device in FIG. 1.

FIG. 6 shows locating results for explaining the effect of operation of the device in FIG. 2. In FIG. 6, a curve (a) shows the result obtained by using the filter 22a. An initial portion of the curve fluctuates due to the operation performed by using transient data and, at a time $T_0$ after the fault occurs, it becomes relatively stable with time. Since the filter effect is not sufficient even in the stable state, the result of operation still fluctuates more or less.

A curve (b) is obtained by using the filter 22b. The curve (b) becomes relatively stable at a time $T_1$ ($T_1 > T_0$) after the fault occurrence. The fluctuation in the stable state is smaller than that of the curve (a). A curve (c) is obtained by using the filter 22c. A time $T_2$ ($T_2 > T_1$) from which the curve becomes stable is further delayed. However, the fluctuation in the stable state is substantially negligible.

In the present invention, the persisting time of the fault is measured and, when it is shorter than $T_1$ in FIG. 6, the output of the filter 22a is used. When it is shorter than $T_2$, the output of the filter 22b is used and when it is longer than $T_2$, the output of the filter 22c is used. Therefore, the distance measurement is obtained through one of the filters which has an optimum response characteristics to a time in question with an optimum accuracy regardless of the length of the time, which is a remarkable advantage with respect to the conventional measurement using a single filter.

The fault time measuring device 23 may be realized in various manners. For example, an under voltage relay system may be the simple way in which the system voltage is monitored and a time when the voltage drops below a constant value is measured. The system voltage is lowered simultaneously with an occurrence of fault and is recovered after the fault is removed. In a case where the voltage becomes zero after the fault is removed as in the case of a capacitance potential device (PD) on the line side, an overcurrent detecting element may be used to add, to the detection conditions of fault persistence, a condition that the current value of the line is at least a constant value.

There may be a system which has a function corresponding to a conventional impedance relay and determine a fault when an impedance of the line is fallen within a predetermined range.

In the present invention, the selection of filter is controlled according to the fault persisting time. Therefore, if the fault persisting time is longer than $T_2$ in FIG. 6, it is possible to commence the fault point locating operation in the fault locating calculation device 26 during the persisting time. However, it is usual to commence such operation after the fault is removed. The memory circuit 18 stores the system voltage data V and the current data I over a constant time period and the data are up dated. In this case, the data while the fault persists must be held therein until the fault locating calculation is completed.

If the operation time is too long and there is a possibility of up-dating of the data when the fault occurs, it may be necessary to shift the data to another memory area.

Figure 7:
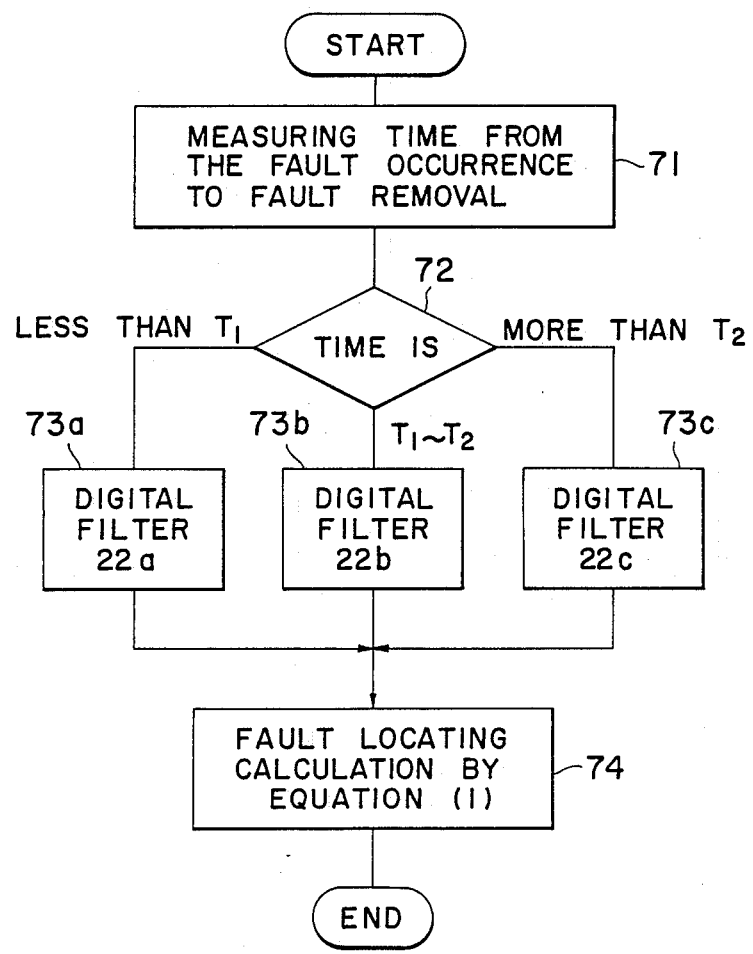
FIG. 7 is a flow chart of an operation of the portion of the device shown in FIG. 2.

FIG. 7 is a flow chart of the operation in the embodiment in FIG. 2. Firstly, a time period from the fault occurrence to the removal of the fault is measured in the fault time measuring device 23 (step 71). When the time is shorter than $T_1$, the digital filter 22a, when it is within $T_1$-$T_2$, the digital filter 22b and when it is longer than $T_2$, the digital filter 22c are selected by the switching control device 24 through the AND gates 25a, 25b and 25c, respectively, (steps 73a, 73b and 73c) and the selected filter is connected to the fault locating calculation device 26. The device 26 executes the operation of the equation (1) by using the supplied voltage and current data (step 74).

In the above embodiment, the locating is performed by using the equation (1). However, the present invention is not limited to such case and can use any other principles so long as they can locate the distance to the fault point. For example, it is possible to use not only the conventional current difference but also the current itself and locate the fault point according to the following equation.

$$X = \frac{I_m(V_s \cdot I_s^*)}{I_m(ZI_s \cdot I_s)} \qquad (7)$$

The number of the digital filters to be used is arbitrary so long as it is two or more.

Further, the present invention can be applied to filters having other functions than those expressed by the equations (3), (5), (6). For example, a filter having a function which is a combination of the equations (3) and (4) may be used in the present invention.

The locating calculation may be commenced by a reception of a fault detection signal supplied from an external device or by judging a fault from voltage and current informations obtained by own device. In the latter case, it is easily practiced by, for example, a detection of a voltage drop.

The present invention may be constituted with analog filters. However, it may require extra hardwares. Therefore, the present invention constituted with the digital filters and operative according to only softwares is considerably advantageous.

As mentioned hereinbefore, according to the present invention, a plurality of digital filters having different filter functions are selectively used according to the fault persisted time through which the electrical amounts from the memory storing voltage and current data while the fault persisted are supplied to the associated devices to calculate the location of the fault. Therefore, it is possible to locate the fault point according to the fault persisted time as accurate as possible.

What is claimed is:
1. A digital fault locator for locating a fault point of a power transmission system by using digital voltage and current data of the power transmission system, comprising:
   a memory portion for storing digital data of the power transmission system,
   a plurality of digital filters having different filter functions, for receiving said data from said memory portion,
   a fault time measuring means for measuring a total time duration for which a fault persisted, using said digital voltage and current data of a faulty period,
   a switching means connected to said fault time measuring means and being only responsive to the total time duration of said fault measured by said fault time measuring means for selecting an output of only one of said digital filters after the expiration of said total time duration, and
   a fault locating calculation means for locating the fault point by using the output of the digital filter selected by said switching means.
2. The locator as claimed in claim 1, wherein said fault locating calculation means calculates the location of the fault point according to

$$X = \frac{I_m(V_s \cdot I_s'''^*)}{I_m(ZI_s \cdot I_s'')}$$

wherein X is a distance to the fault point, $V_s$ is a voltage at said locator, $I_s$ is a current at said locator, $I_s''$ is a difference at said locator between currents measured before and after the fault, Z is an impedance of a unit length of a power transmission line, $I_m$ is an imaginary part and * represents a conjugate complex number.

3. The locator as claimed in claim 1, wherein said fault locating calculation means calculates the location of the fault point according to $$X = \frac{I_m(V_s \cdot I_s^*)}{I_m(ZI_s \cdot I_s)}$$

where X is a distance to the fault point, $V_s$ is a voltage at said locator, $I_s$ is a current at said locator, Z is an impedance of a unit length of a power transmission line, $I_m$ is an imaginary part and * represents a conjugate complex number.

4. The locator as claimed in claim 1, wherein said digital filters include three digital filters constituted according to digital functions $F=(1-Z^{-N})/2$
$F=(1-Z^{-N1})\cdot(1-Z^{-N2})/4$ and
$F=(1-Z^{-N1})\cdot(1-Z^{-N2})\cdot(1-Z^{-N3})/8$, respectively, where Z represents a harmonic component sampled at a preceding N, N1, N2 or N3-th sampling time.

5. The locator as claimed in claim 1, wherein said switching means includes AND gates for selectively passing the output of one of said digital filters.

6. The locator as claimed in claim 1, wherein said fault time measuring means measures a time for which a voltage of said power transmission system reduces below a predetermined level.

7. The locator as claimed in claim 1, wherein said fault time measuring means measures a time for which an impedance of said power transmission system is within a predetermined range.

* * * * *